US005111508A

United States Patent [19]

Gale et al.

[11] Patent Number: 5,111,508

[45] Date of Patent: May 5, 1992

[54] AUDIO SYSTEM FOR VEHICULAR APPLICATION

[75] Inventors: Vannin Gale, Riverside; David Kwang, Pasadena, both of Calif.

[73] Assignee: Concept Enterprises, Inc., Vernon, Calif.

[21] Appl. No.: 460,635

[22] Filed: Jan. 3, 1990

Related U.S. Application Data

[63] Continuation-in-part of Ser. No. 314,509, Feb. 21, 1989, Pat. No. 4,905,284.

[51] Int. Cl.[5] ..... H03G 5/00

[52] U.S. Cl. ..... 381/100

[58] Field of Search ..... 381/99, 100, 24

[56] References Cited

U.S. PATENT DOCUMENTS 3,657,480 4/1972 Cheng et al. .

4,293,821 10/1981 Boudouris et al. ..... 330/126

4,329,544 5/1982 Yamada .

4,429,181 1/1984 Freadman ..... 381/99

4,583,245 4/1986 Gelow et al. ..... 381/100

4,622,691 11/1986 Tokumo et al. ..... 381/86

4,633,501 12/1986 Werrbach ..... 381/100

4,648,117 3/1987 Kunugi et al. ..... 381/86

4,759,065 7/1988 Field et al. ..... 381/98

4,771,466 9/1988 Modafferi ..... 381/99

4,905,284 2/1990 Kwang ..... 381/100

*Primary Examiner*—James L. Dwyer

*Assistant Examiner*—Sylvia Chen

*Attorney, Agent, or Firm*—Merchant, Gould, Smith, Edell, Welter & Schmidt

[57] ABSTRACT

An audio processing module (20) capable of virtually infinite segmentation of the audio frequency spectrum. The module (20) comprises a first submodule (22), a second submodule (24) and a subwoofer module (28). The first and second submodules (22, 24) are substantially identical, each containing a high pass signal path (112), a high pass band signal path (114) and a low pass band channel (116). A mixed input/output port (29) provides a means for serial chaining of multiple modules.

20 Claims, 6 Drawing Sheets

AUDIO SYSTEM FOR VEHICULAR APPLICATION

CROSS REFERENCE TO RELATED APPLICATION

This application is a continuation-in-part application of application Ser. No. 314,509, filed on Feb. 21, 1989, now U.S. Pat. No. 4,905,284.

BACKGROUND OF THE INVENTION

1. Field of the Invention

The present invention is related generally to apparatus and methods for high fidelity sound reproduction, and more particularly to systems and methods for efficiently modifying signal characteristics in different frequency bands in a multi-driver, multi-speaker audio system, especially one installed in a vehicle.

2. Description of Related Technology

Electromechanical transducers such as loudspeakers and other audio drivers are not able to provide accurate, uniform output with respect to frequency response and sound pressure level. Traditional audio drivers are invariably limited to a relatively narrow frequency range, their performance often being compromised in an effort to extend their audio bandwidth. In virtually every case, the greater the bandwidth of the audio driver, the larger the degradation must be to the audio driver's performance.

For example, a 15" diameter audio driver (woofer) has mechanical characteristics such that it has significant difficulty in reproducing a 20,000 Hz signal, although it may offer uniform response at lower frequencies in the range of say 1kHz down to 50Hz. This is primarily due to the audio driver's inherent mass and compliance (mechanical resistance). At the other extreme, a driver of approximately 0.5" diameter (tweeter) cannot accurately reproduce a 50Hz signal because it cannot generate sufficient pressure variations in moving air at such low frequencies. This then explains why there are no single driver, high performance, full range, high fidelity loudspeakers. Generally, the greater the quantity of different individual drivers used in a loudspeaker system the higher the level of potentially attainable performance. Naturally there are physical, financial and practical limits on the total number of actual drivers that can be used in a typical high fidelity system.

High fidelity sound reproduction typically is measured in terms of flatness of response across the audible spectrum, usually 20Hz to 20kHz. Few adults are capable of sensitive perception across the entire range, and there will always be individual preferences as to accentuation of certain frequency characteristics (such as a juvenile desire for excessive bass). Practically always, however, there must be a smooth transition between different frequency bands.

When a high fidelity system is installed in a vehicle, however, special problems are introduced because of the small internal vehicle volume and the limited locations for speaker and electronic circuit installation. Sound waves from any given speaker travel typically only a relatively few feet before encountering a reflecting or partially absorbing surface and being diverted in another direction toward another surface. The direct and internal reflections introduce phase reinforcements and cancellations which give rise to resonances and nulls at virtually arbitrary frequencies throughout the band. These must be equalized in some manner if the potential of the system is to be realized, and so it is now quite common in vehicle sound systems to employ graphic equalizers and electronic crossover circuits. As presently employed, however, these techniques have definite limitations, whether used separately or together. The graphic equalizer, for example, enables amplitude adjustment of frequency slices, but these are predetermined and fixed. The electronic crossovers function to shift the center frequencies and end limits of a frequency band, but this does not provide the flexibility now needed.

There has been for some time a growing trend toward the use not only of separate speakers, but also separate amplifiers receiving signals in different channels. This applies to both newly installed systems and modifications of existing sound systems. When adding more speakers, such as tweeter, woofer or subwoofer, new resonance and crossover problems must be overcome, arising from the nature of the component, its relation to other components and its placement in the vehicle. Prior art systems do not provide enough flexibility to make the numerous and subtle adjustments that are needed in installing and expanding a system.

It should be understood that just as with high fidelity fanciers for home applications, there has been a constant tendency toward more elaborate and more precise vehicular installations. Not only are separate component systems offered as original equipment with new vehicles; purchasers desire more power, or more speakers, or better performance, or any combination of these for existing installations. The present invention affords the flexibility and adaptability needed to upgrade under a wide variety of conditions.

One of the most common techniques for flattening the frequency response characteristics in a vehicle is to utilize graphic equalizers, centered at frequencies that are spaced one-third octave apart. Thus, three equalizers are used to cover the band of 10kHz to 20kHz, three are used for the 5kHz to 10kHz band, three are used for the 2.5 to 5kHz band and so forth. More than 30 graphic equalizers may have to be used, and because these cover fixed frequency ranges and there is no assurance that a resonance or a null will occur in the center of a range, it can be difficult to achieve suitably precise flatness in frequency response even with this system.

SUMMARY OF THE INVENTION

Systems and methods in accordance with the invention enable virtually infinite segmentation and modification of the audio frequency spectrum by transfer of signals from a source in both parallel and serial processing chains. Individual electronic crossover modules are arranged with standard but widely adjustable submodules, each of which encompasses specific overlapping acoustical bands, together with a separate low frequency section which may function in common with different sources. By serial processing of signals, frequency band cutoffs may be chosen to achieve higher order selective characteristics.

Segmentation of the acoustic band with virtually infinite variety is achieved by the use of multiple submodules, each having adjustable low pass, bandpass and high pass filters. The upper range of cutoff for the low pass filter and the low end of the bandpass filter are approximately the same, as are the lowest limit of the upper end of the bandpass and the lowest value selectable for the high pass filter. In addition the filter channels also include means for shifting the cutoff points by a multiplying factor to a substantially higher level. An input switching channel enables separation or combination of signals from different sources, while a mixing input/output provides both external interconnection and transfer of signals to a very low frequency (subwoofer) channel, since lowest frequency signals are not strongly stereophonic in character. By coupling the outputs of one module, such as the pass band, to the input of another, a high degree of frequency segmentation is achieved Where a higher cutoff attenuation rate is desirable, cutoff regions may be set at like levels to increase a standard cutoff (e.g. 12db) to a higher figure (such as 24db or 36db). These cutoffs, it must be emphasized, need not be at fixed points.

Further versatility in signal modification is achieved in each group of submodules by incorporating a parametric equalizer which can independently adjust frequency, amplitude and figure of merit (Q}to compensate for input signal characteristics. Phase reversal and bass boost may be incorporated in the submodules and subwoofer channel respectively. Because of the ability to overlap frequency bands and to modify cutoff characteristics, the present invention provides a feasible solution for virtually any installation problem. To achieve best performance with a given driver and amplifier installation, very sharp cutoffs can be used at each end of the predetermined frequency band. Moreover, if desired, a number of adjacent frequency bands can be driven in the same way, with each amplifier/speaker combination used under its optimum conditions. Similarly, where there is substantial signal amplitude reduction in a given band, this can be compensated for by using an appropriately sized speaker and matched amplifier using the expandability inherent in the system. This makes possible a deliberate redesign of an existing installation, by taking advantage of the inherent power curve characteristics of an audio system. For example, the power requirement for a woofer is substantially greater than what is needed for mid-range and upper range speakers. Thus, an existing amplifier can be used, together with the crossover system, to provide a greater proportion of its power to a reduced bandwidth woofer and to a reduced bandwidth tweeter, with the gap being filled by a relatively low powered mid-range amplifier and mid-range speaker, thus improving both the response, power and the sound pressure level of the system, while significantly reducing the intermodulation distortion products that occur whenever a driver (loudspeaker) is operated beyond its optimum frequency or power range.

BRIEF DESCRIPTION OF THE DRAWINGS

A better understanding of the invention may be had by reference to the following description, taken in conjunction with accompanying drawings, in which.

DETAILED DESCRIPTION OF THE INVENTION

Figure 1A:
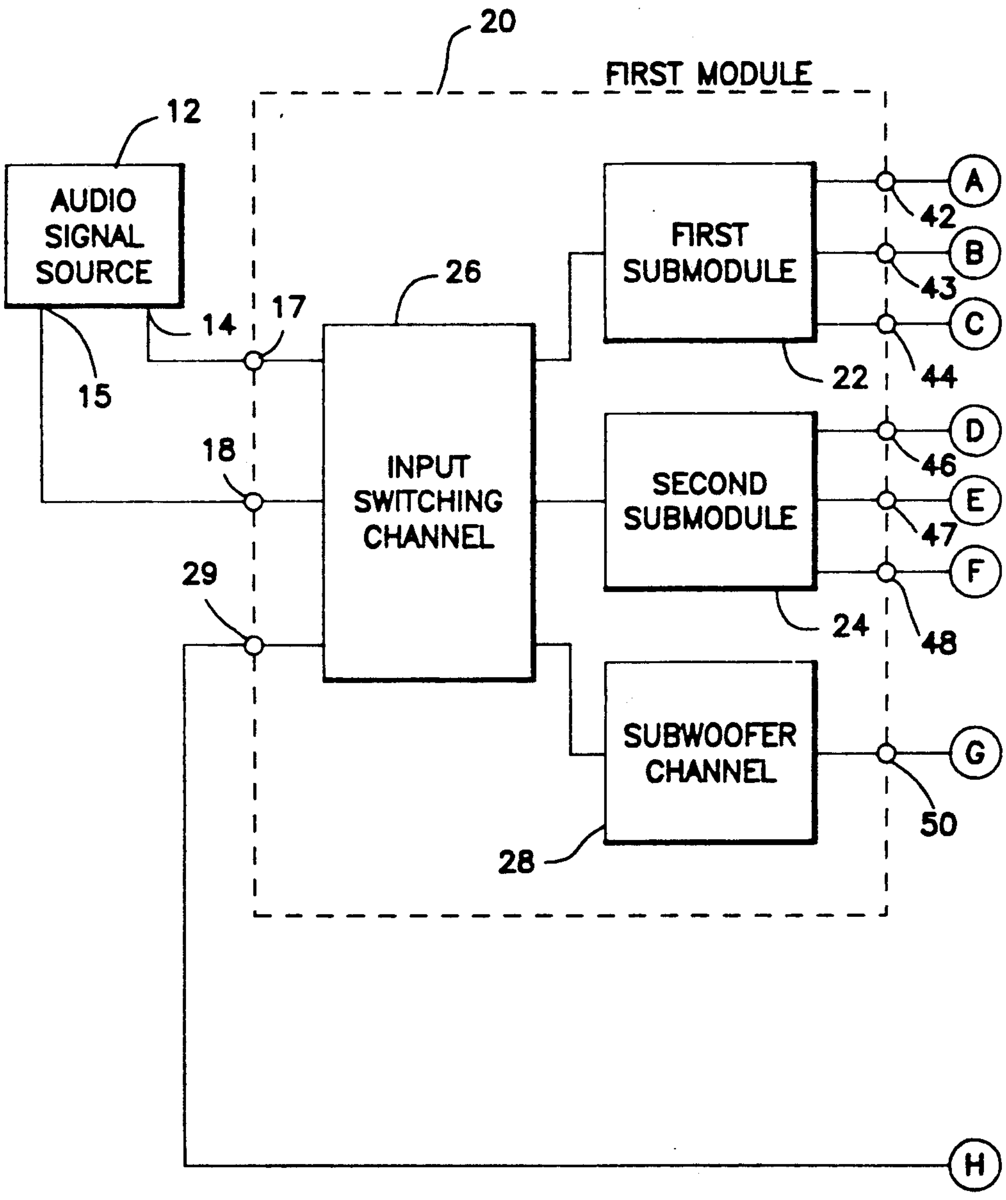
FIGS. 1A and 1B are block diagram of a system in accordance with the invention, as configured in a typical vehicular application.
Figure 1B:
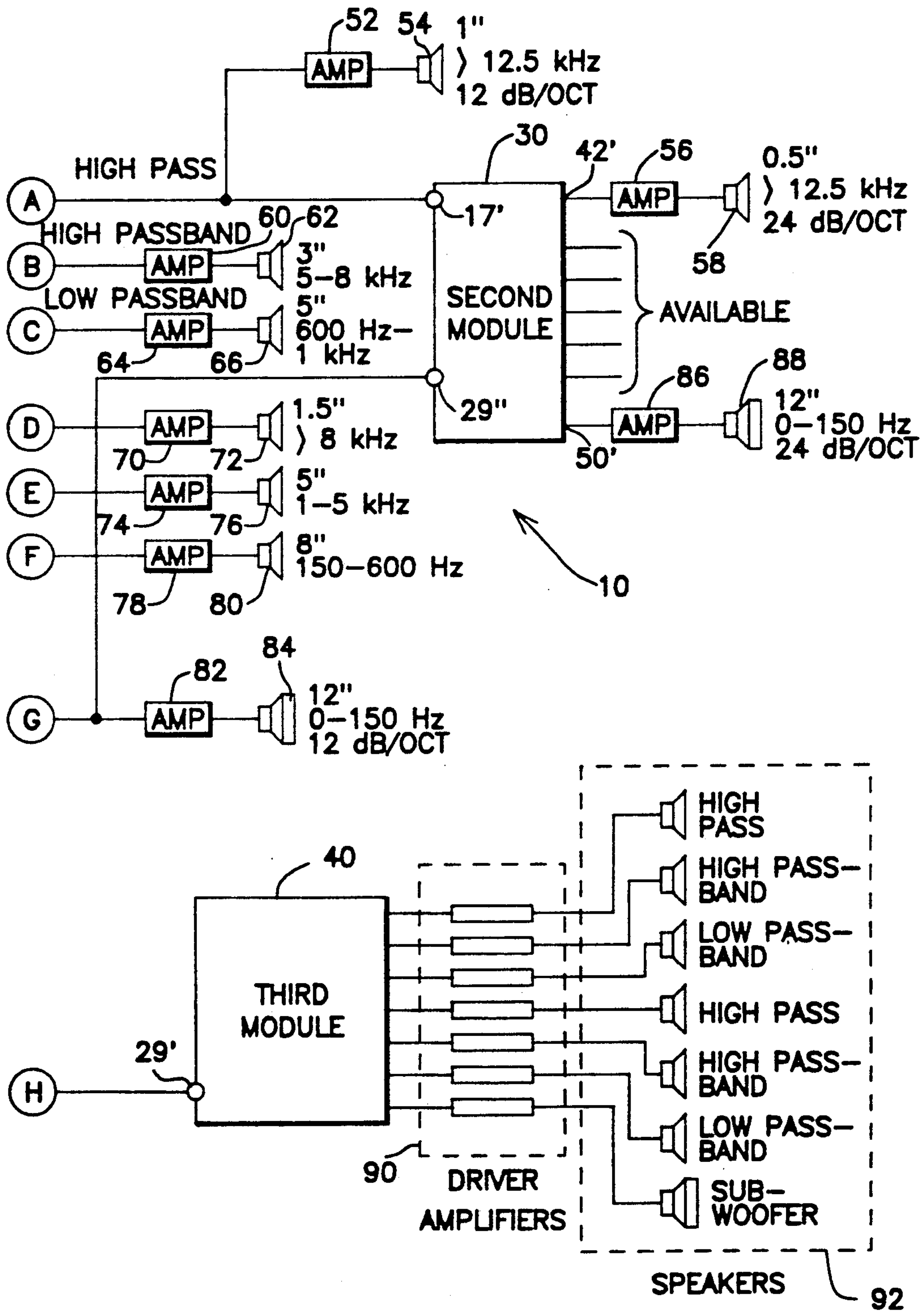

Referring to FIG. 1, an audio signal processing and reproducing system 10 in accordance with the invention, is depicted as it might be configured in a typical installation. This installation utilizes both frequency segmentation of the audio band, and serial signal modification, in what may be called vertical and horizontal chaining or parallel and serial processing. The audio signal source 12, such as a radio receiver, cassette or CD player, provides (typically) stereo signals and it should be specifically understood that this system generally is intended to operate in a stereo mode, but that the left and right channels are not separately illustrated even though both are present. Adjustment of frequency bands using controls within the system is to be understood as applying to both of the stereo channels in like fashion. The audio signal source 12 may provide a single stereo output or, as is more often the case, separate front and rear outputs, using a fade control (not shown) for appropriate adjustment of the amplitude levels. The present example shows both front and rear connectors 14, 15, coupled to separate input ports 17, 18 of a first module 20, only the principal elements of which are shown in FIG. 1. The first module 20 incorporates a first and second group of submodules 22, 24, these being of substantially like configuration and interconnected by an input switching channel module 26 which is also connected to a subwoofer channel 28. The first submodule 22 is in a series circuit with the first input port 17 and the second submodule 24 is in a series circuit with the second input port 18, so that the front and rear signals are segmented and processed separately, although the input switching channel module 26 enables the signals to be coupled in parallel or signals on one line to be fed to the other. The input switching channel module 26 and the subwoofer channel 28 are in a series circuit including a mixed in/out port 29 residing on the first module 20, as described in greater detail hereafter.

In the horizontal, or serial, chaining relationship, output signals from the first module 20 are applied to the inputs of a second module 30, while in a vertical, or parallel, chaining configuration, the input signals from the source 12 are applied to a third module 40 via port 29 in module 20. All modules 20, 30, 40 are substantially alike in configuration and capability, but they are of course used differently in the system. The modules, such as the first module 20, have output ports in a series circuit with the first submodule 22, namely, a first output port 42 which may be referred to as a high pass output, a second output port 43 which may be referred to as a high bandpass output and a third output port 44 which may be referred to as a low bandpass output. The first module 20 also includes similar output ports 46, 47, 48 in a series circuit with the second group submodule 24.

In FIG. 1, three output channels are shown for each of the first and second submodules 22, 24 respectively although as described hereafter, all channels of a module need not be employed. These six channels, together with the subwoofer channel 28 which provide signals through an output port 50, provide a feasible basis for segmentation of the audio band into seven different frequency bands, which may form a contiguous spectrum, may overlap to a substantial degree, or may be separate with the voids to be filled by signals from other sources, such as other speaker systems or the second and third modules 30, 40 respectively. For purposes of description, it should be assumed, as will be shown later, that the signals from the front and rear sources 14, 15 of the audio source 12 are to be separately processed in the first and second submodules 22, 24 respectively, with the signals being summed and applied via selector switch 106 to the subwoofer channel 28 and is simultaneously available at the mixed input/output port 29. FIG. 1 depicts a suitable frequency division and processing example for the first and second modules 20, 30. For the signal in the high pass channel at the output port 42, only the frequency band above 12.5kHz is retained, a portion of which is sent to a driver amplifier 52 and a suitable small tweeter speaker, such as a 1" element 54. The same output is also supplied to the first input port 17' of the second module 30, in which only the high pass output channel at the output port 42' is utilized, affording a fourth order (24db) crossover rate to be in effect, this signal going to a different driver amplifier 56 coupled to a supertweeter 58 (e.g. a 0.5" speaker). At the high bandpass output port 43, the driver amplifier 60 is coupled to a slightly larger speaker, such as 3" speaker 62, the signal here being selected to cover the 5kHz to 8kHz range. The driver amplifier 64 coupled to the low range bandpass output carries the 600Hz to 1kHz signal and drives a 5" speaker 66 via port 44. The frequency ranges given are by way of illustration only, it being understood that they are adjustable and that the sizes of the speakers given are merely typical sizes which can be modified by the system designer at his selection. The gaps in the frequencies are supplied at the outputs of the second submodule 24 and the subwoofer channel 28. Signals of greater than 8kHz are derived at the high pass output port 46, although frequencies as low as 125Hz are available, via an amplifier 70 and a 1.5" speaker 72. The high bandpass signal at the port 47 is coupled to an amplifier 74 which drives a 5" speaker 76, while an 8" speaker 80 is driven from the output port 48 by the low bandpass signal via an amplifier 78. The high bandpass signal covers the 1 to 5kHz range in this example, while the low bandpass signal covers the 150 to 600Hz range. The subwoofer 84 is a 12" speaker driven by a subwoofer amplifier 82 coupled to the subwoofer output port 50. In accordance with conventional design standards, the cutoff characteristics of all the channels in the modules 20, 30, 40 are 12db. The subwoofer channel in the second module 30 in this example is set to encompass the 0 to 150Hz band, as is that in the first module 20, the output signal from the port 50' driving a subwoofer amplifier 86 and a 12" speaker 88, having a cutoff characteristic of 24db. It will be understood that if another module (not shown) were also coupled in like serial fashion, having a similar cutoff point, the cutoff characteristic would be extremely sharp, at 36db. Also, if the cutoff points are not chosen at precisely the same places, they can give a cutoff characteristic which is of a changing character, such as a gradual initial slope followed by an abrupt transition. The 24db per octave characteristic, however, is also maintained at the supertweeter 58, for purposes of this example. Thus there is a very abrupt high pass cutoff and a very abrupt low pass cutoff in the two signals from the second module 30. This is sufficient to illustrate the serial chaining operation, but it should be realized that many other possibilities exist for the outputs that are unused in this exemplification. For example, within the second module 30 the inputs of the two submodules may be chained together, and a separate tweeter or supertweeter output may be driven from the same input. The output from the higher bandpass port 43 or the lower bandpass port 44 may be coupled to the second input port (not shown) and there may be further segmentation of the chosen band, with or without increase in the cutoff.

At the third module 40, the mixed input/output from the port 29, which can support an infinite number of modules 20, 30, 40, is coupled to the corresponding port 29', to provide the full range input signal, which then can be used to drive as many as seven different amplifiers in a set of amplifiers 90, each individual amplifier in the set being coupled to a different speaker in a group 92 of speakers, which are not individually numbered but correspond to each of the seven channels available in the third module 40. This group is identified with the same characterization of high pass, high bandpass, low bandpass and subwoofer, but in point of fact the wide ranges that are covered and the substantial overlaps that are available permit substantial variation in the emphasis on high, middle and low frequency ranges. In a vehicle, it would not be unusual for the nine channels, actually eighteen speakers, represented in the stereo system equivalent of FIG. 1, to be dispersed throughout the front, sides and rear portion of a vehicle. For the enthusiast who desires even greater power and flexibility, the use of a third module and the set of seven additional channels or fourteen speakers, would be available.

Figure 3:
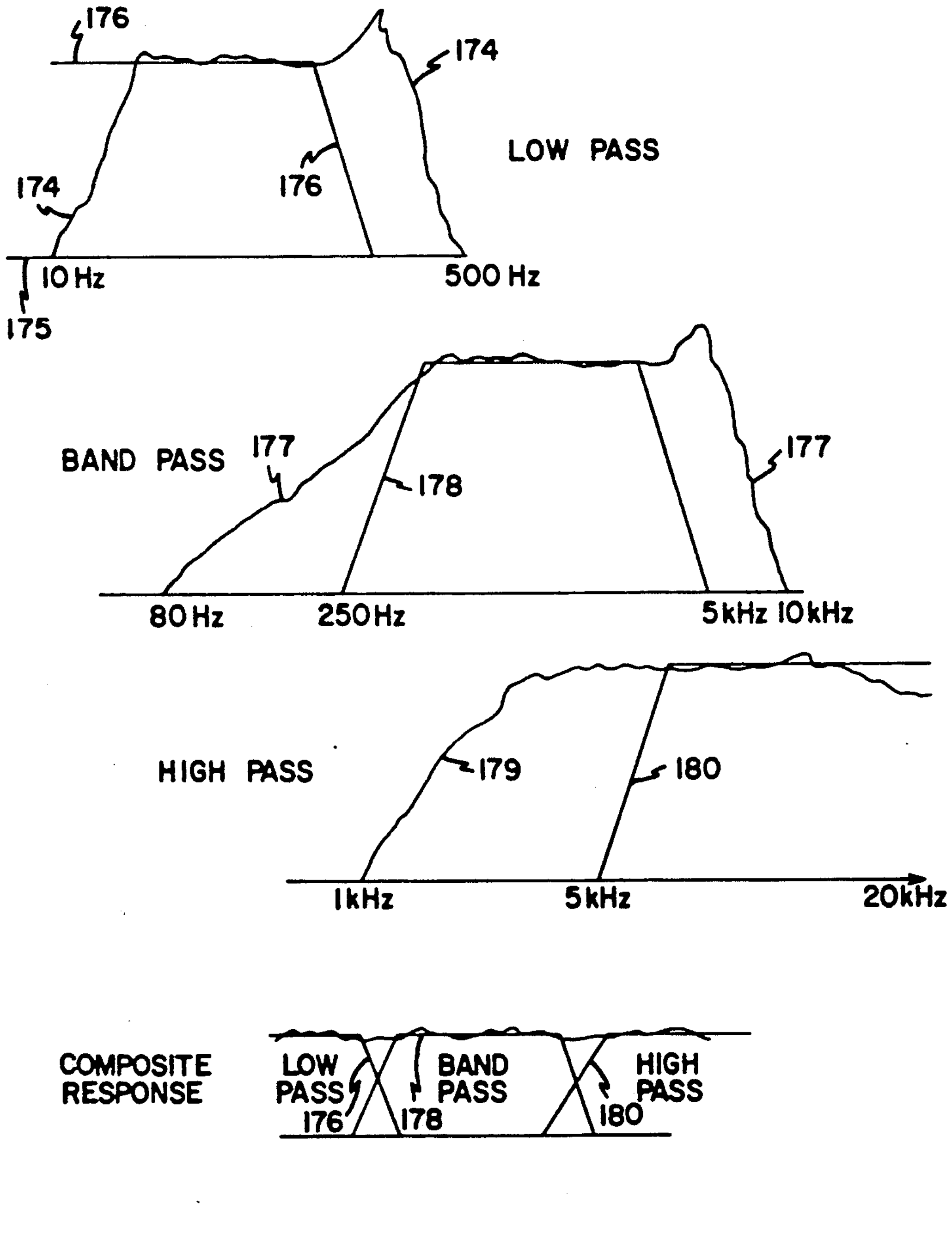
FIG. 3 is a frequency division chart showing typical settings in the configuration of FIG. 1.

The system of FIG. 1 provides a separation of frequencies, and a theoretical interrelationship of some cutoff points is shown in the graphic of FIG. 3. Starting from the low frequency end 175, the response of a typical 12" woofer is shown at 174. The low pass response is set, for example, as shown at 176 so as to correspond with woofer performance. One low pass band speaker 80 covers the 150 to 600Hz range, while another speaker 66 covers the range of 600Hz to 1kHz. The two upper bandpass cutoffs (corresponding to speakers 76 and 62) cover the 1-5kHz and 5-8kHz bands respectively. The response characteristics of a typical 5" midrange speaker are shown at 177, and the adjustment of passband response 178 is adjusted accordingly. One tweeter 72 then covers the entire range above 8kHz, and another tweeter 54 covers the range of above 12.5kHz, both with 12db cutoffs. The final supertweeter 58 covers the range above 12.5kHz with a 24db per octave cutoff. Typical 1" tweeter response is shown at 179, and high pass characteristics compatible with such a tweeter are shown at 180.

With this arrangement of different frequencies and cutoff points, and the overlapping between frequency bands, whatever conditions are encountered as actual response characteristics within an installed system can be accommodated, particularly within the close and multiresponse reflecting surface structure of a vehicle. The ability to cover overlapping bands and shift cutoff points gives virtually infinite the possibilities, since channels can be used in complimentary, redundant or other fashion. In addition, the modules can be extended so as to be chained in parallel or serial fashion, or both, with the ultimate configuration being a complete matrix, if necessary. Although only three response curves are shown in FIG. 3, the composite effect of numerous adjustable bandwidth characteristics for multiple speakers, each covering its own, discrete optimum range, can be readily visualized. The number of various combinations is so vast as to prevent the literal depiction of all possibilities and FIG. 3 is intended to depict the underlying theory only.

Figure 2A:
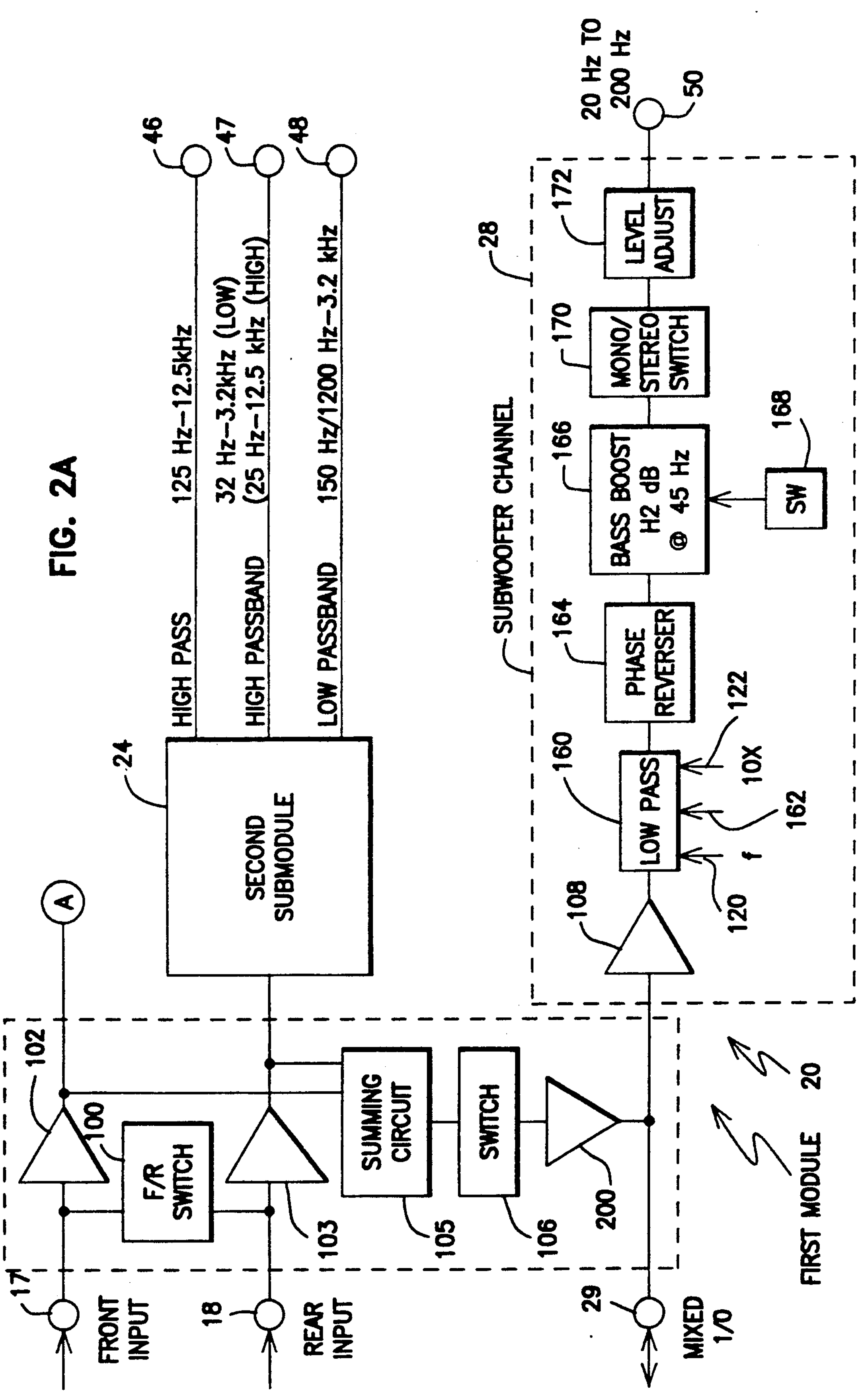
FIGS. 2A and 2B are a combined block and simplified circuit diagram of a module in accordance with the invention as may be employed in the system of FIG. 1.
Figure 2B:
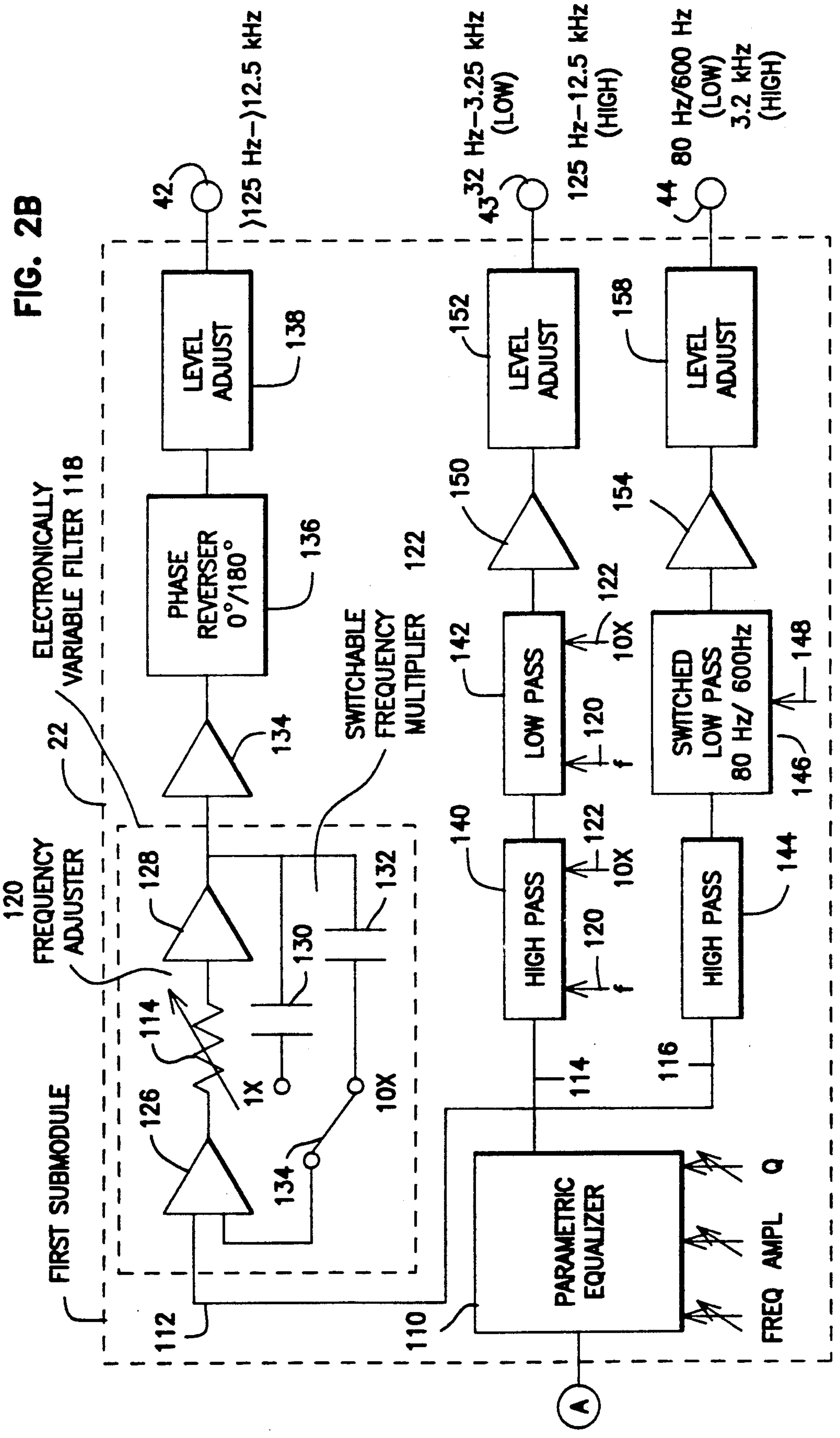

In a detailed example of a module, such as the module 20 shown in FIG. 2, only the first submodule 22 and the subwoofer channel 28 are shown in some detail, inasmuch as the second module 24 is substantially identical to the first. In the input switching channel 26, the two input ports 17, 18 are coupled together, when desired, by front/rear coupling switch 100, so that if only the front (or rear) signal is received, both grouped submodules can be driven. The inputs are coupled to the associated submodules via buffer amplifiers 102, 103 while the output signals from these amplifiers are fed together to a summing circuit 105 which is coupled by a switch 106 to a buffer 200, and then presents itself both at the mixed input/output port 29, and the input of the subwoofer low pass filter 28. The same port 29 can be used as an input for the subwoofer channel 28, exclusively. However, the mixed input/output port 29 makes available a full range of audio spectrum, since it is summed prior to any equalization or filtering.

In the first grouped submodule the input signal, covering the acoustic band, is fed to a parametric equalizer 110, a commercial product which has frequency, amplitude and filter adjustments. The parametric equalizer 110 is adjustable in frequency to provide an accentuated, or reduced, signal using the amplitude control, with the bandwidth of this signal being set by the Q control. The frequency, amplitude and Q controls are manual, and are selected by individual testing and adjustment of the system during installation. Thus, if a given resonance peak or dip exists in the uncompensated acoustic band, on analysis of the signal response, the parametric equalizer can adjust the response characteristics and precompensate for this signal characteristic. Other peaks or nulls that would tend to affect the flat response must be handled by other means in systems in accordance with the present invention.

From the parametric equalizer 110 the signal is divided into three channels, namely, a high pass filter channel 112, a high bandpass channel 114, and a low bandpass channel 116, each arranged differently, in accordance with the invention. The high pass channel 112 incorporates an electronic high pass filter 118, which incorporates a frequency adjuster 120 and a switchable frequency multiplier 122. As shown in the circuit components of the electronically variable filter 118, the frequency adjuster 120 may comprise principally an adjustable resistor 124 coupling a pair of operational amplifiers 126, 128 in series, and the switchable frequency multiplier circuit 122 comprises, in this combination, a pair of capacitors 130, 132 which may be alternatively selected by a single pole double throw switch 134. A first capacitor 130 functions as a 1x multiplier, providing the filter 118 with its 1x or nominal frequency range of 125Hz to 1.25kHz. The second capacitor 132, when it is in the circuit, establishes a cutoff frequency of 10x for a range of 1.25kHz to 12.5kHz. The high pass cutoff may therefore be anything from 125Hz to 12.5kHz, and the frequency band transmitted then goes to the upper reaches of the useful acoustic band, usually regarded as being in the 20–25kHz range. Finally the signal is provided through a level adjust circuit 138 whose output is available at port 42.

In the second channel 114, a high bandpass frequency segment of selectable limits is achieved by using a high pass filter 140 and a low pass filter 142 in series, each having a frequency selector 120 and a switchable frequency multiplier providing either 1x or 10x multiplication of the cutoff frequency as previously described. The high pass filter operates in the 1x range of 125Hz to 1.25kHz, and when the 10x setting is used, ranges from 1.25kHz to 12.5kHz. The low pass portion of the second channel 114 operates, at the 1x setting, from 32Hz to 320Hz, so that the 10x setting gives 320Hz to 3.2kHz.

The low bandpass channel 116 has an electronically variable high pass filter 144, controlled as previously described, and settable at the 1x range from 125Hz to 1.25kHz, with the 10x range thus being from 1.25kHz to 12.5kHz. Thus this high pass filter covers the total range from 125Hz to 12.5kHz. The series coupled low pass filter 146, however, is only switch connected, to have a low pass setting of 150Hz or 600Hz, controlled by a switch 148, and has a frequency of 80Hz or 1200Hz in the equivalent group submodule 24.

Prior to reaching the output of the second channel 114, the bandpass filtered signal is supplied through a buffer amplifier 150 and a level adjust circuit 152 to the second output port 43. Similarly, a signal from the low bandpass filter in the third channel 116 is passed through a buffer amplifier 154 and a level adjust circuit 158 to the third output port 44.

In the subwoofer channel 28, the signal from the buffer amplifier 108 is supplied to an electronically variable low pass filter whose cutoff is selectable in the range from 20 to 200Hz by a frequency control 162. This signal is applied to a switchable phase inverter 164 and to a base boost circuit 166, which supplies a one octave 12db boost at 45Hz, when coupled into the circuit by a switch 168. At this point the stereo signals may be combined, using a mono-stereo switch 170, and passed through a level adjust circuit 172 to the output port 50.

Figure 4:
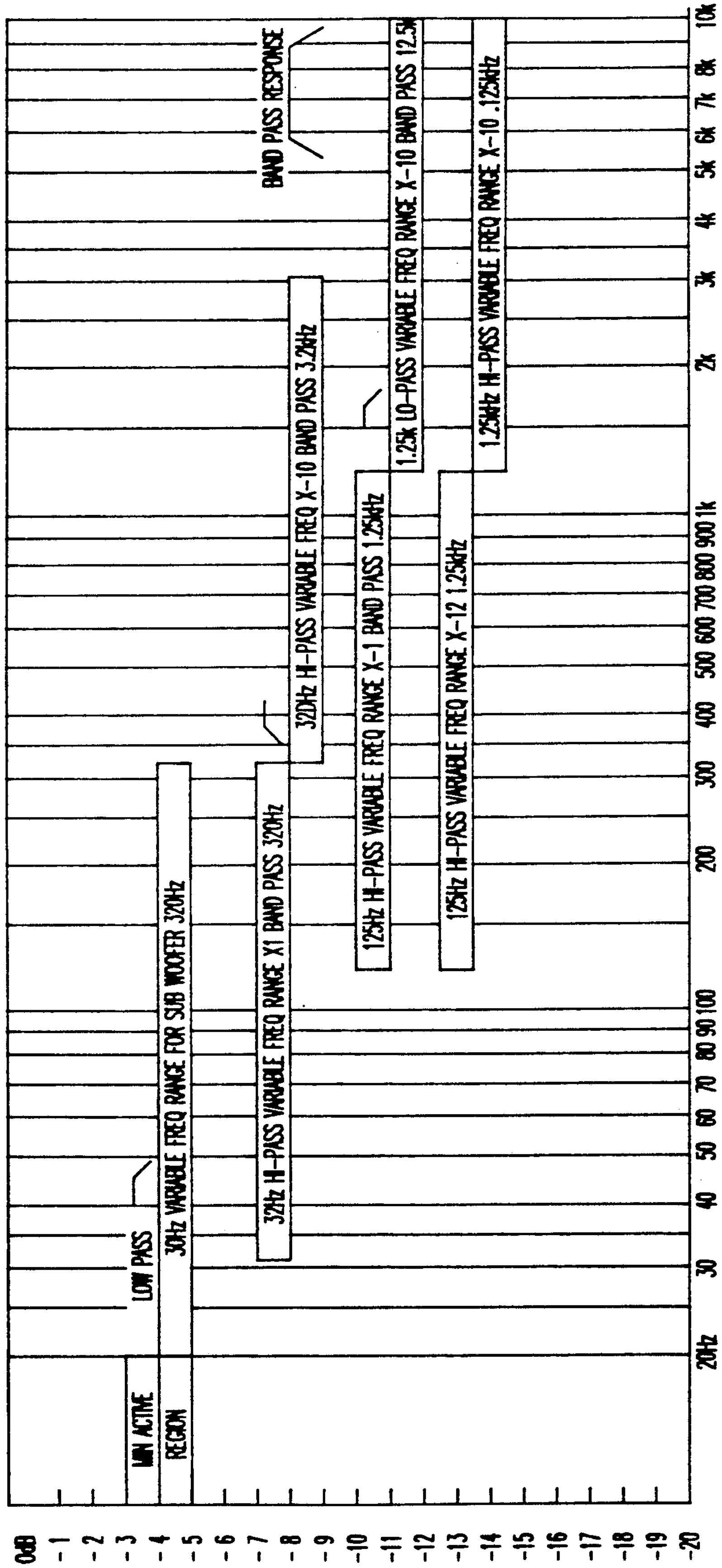
FIG. 4 is a graph of frequency response characteristics for a partial system in accordance with the invention, showing how relatively flat response and specified cutoff characteristics are achieved.

The adjustments made possible by the submodules 22 and 24, and the subwoofer module 26 provide the essential versatility needed in the system of FIG. 1. Note, with respect to FIG. 4, that the high pass channel substantially completely overlaps the high bandpass channel 114, and even a substantial part of the low bandpass channel 116. The two bandpass channels 114, 116 are in good part coextensive, and also overlap the subwoofer channel 28. Using 12db per octave cutoffs, conventional performance is assured during merging of signals between adjacent frequency bands. By the serial chaining of the electronically variable filters, with consequent increase in the sharpness of the cutoff characteristic, special speaker characteristics or optimum use of speaker characteristics can be utilized. This system also provides a number of other features that add to the versatility and practical aspects of the system. These include the ability selectively to reverse the phase of signal so as to compensate for speaker locations and assure against phase cancellation of signals. Also, it is convenient to utilize a defeatable bass boost in the subwoofer channel, together with the selectable mono/stereo switch. Because subwoofers frequencies are much less directional in character than higher frequencies, and because they require substantially greater power, supplying them in a separate channel substantially improves overall performance. In addition, combining the inputs from the front and rear feed lines from the acoustic source, and combining the stereo signals into a mono channel, reduces sensitivity to major variations in volume that can occur in the lowest frequency range, and be disruptive to program material.

It will be apparent to those skilled in the art that various modifications and additions may be made in the method and apparatus of the present invention without departing from the essential features of novelty thereof, which are intended to be defined and secured by the appended claims.

What is claimed is:

1. A system for versatile control of emanated sound from multiple speakers in response to a signal source to enable matching to a given confined reflective environment comprising:

(a) a plurality of electronic crossover devices, each of the crossover devices including means for receiving inputs from outputs of a different crossover device of from said signal source, and including separate low pass, band pass and high pass adjustable filters, and selectively operable means for multiplying the effective cutoff region of the filters by a selected integral number; and (b) means for intercoupling the electronic crossover devices in a two-dimensional array, with filters coupled in series such as to increase the cutoff characteristic.

2. The system of claim 1, further comprising a parametric equalizer, the parametric equalizer being electrically interposed between the signal source and the plurality of electronic crossover devices.

3. The system of claim 2, wherein the parametric equalizer comprises:

(a) a first signal adjustment control, the first signal adjustment control being capable of varying signal source amplitude;

(b) a second signal adjustment control, the second signal adjustment control being capable of varying signal source frequency; and (c) a third signal adjustment control, the third signal adjustment control being capable of varying signal source bandwidth, the parametric equalizer thereby being capable of altering signal source characteristics prior to processing by the plurality of electronic crossover devices.

4. The system of claim 3, wherein at least one electronic crossover device further comprises:

(a) a high pass filter channel;

(b) a high bandpass channel; and (c) a low bandpass channel, wherein each channel is capable of processing signals having substantially identical frequencies.

5. The system of claim 4, wherein frequency ranges processed by the high pass filter channel, the high bandpass channel and the low bandpass channel are individually variable within each channel.

6. A signal processing method for use in vehicular and like applications comprising the steps of:

(a) defining a first set and a second set of three parallel signal channels;

(b) coupling an input port to each channel;

(c) selecting at least one cutoff point for each signal channel;

(d) providing a low pass filter in a first channel;

(e) providing a bandpass filter in a second channel;

(f) providing a high pass filter in a third channel;

(g) multiplying the cutoff points by a predetermined factor; and (h) selectively coupling an output from a signal channel to the input port of another set.

7. The signal processing means of claim 6, further comprising the step of passing the signal through a parametric equalizer prior to processing of the signal by the first and second parallel signal channels.

8. The signal processing means of claim 7, further comprising the step of individually adjusting signal amplitude, signal frequency and signal bandwidth within the parametric equalizer prior to processing of the signal by either of the two sets of signal channels.

9. The signal processing method of claim 8, further comprising the step of simultaneously applying the signal to a third channel, the third channel processing the signal for use by a subwoofer.

10. The signal processing method of claim 9, further comprising the step of summing a plurality of signals prior to processing by the third channel.

11. A system for supplying adjustably variable audio signals to different sound reproduces in an audio system in response to input signals comprising:

first electronic crossover means responsive to the input signals for separating the signals into a number of channels, the channels each including independently adjustable filter means covering overlapping frequency bands and each having predetermined cutoff attenuation characteristics to provide accessible output signals in selectable frequency bands;

the electronic crossover means including switchable input circuit means selectively coupled to the channels and including means for providing an additional accessible output from at least one of the channels;

a second electronic crossover means corresponding to the first; and means for intercoupling he accessible output signals from the first electronic crossover means as input signals to the second electronic crossover means.

12. The system as set forth in claim 11 above, wherein said first and second electronic crossover means includes a high pass channel, a bandpass channel and a low pass channel, the upper frequency limit of the low pass channel and the low cutoff end of the bandpass channel being substantially the same, and the frequency limit of the high end of the bandpass channel and the frequency cutoff end of the high pass channel being substantially alike at their lowest values.

13. The system as set forth in claim 12 above, wherein the adjustable filter means have 12db cutoff characteristics and wherein the system comprises modular units, each including two parallel electronic crossover means, and each includes input parametric equalizer means for adjusting the frequency and bandwidth of the applied input signals.

14. The system as set forth in claim 13, further comprising a subwoofer channel, coupled to said switchable input circuit means the subwoofer channel being capable of simultaneously processing a low frequency component of all input signals.

15. The system as set forth in claim 14, further comprising a summing circuit, the summing circuit creating a composite signal of all input signals, the composite signal being processed by the subwoofer channel.

16. An electronic crossover module for providing a wide range of adjustments and cutoff characteristics through the acoustic spectrum for use with a plurality of speakers effective in different frequency ranges, comprising:

(a) a module comprising two sets of crossover circuits, each including first, second and third signal channels each signal channel having adjustable crossover means for providing three different frequency band outputs from an input;

(b) input switching means for selectively providing input signals from a source to the two sets of crossover circuits or alternatively from the output of one crossover circuit to the input of the other set; and (c) means in at least one set of crossover circuits for selectively multiplying the levels of the cutoff points to higher levels such that a serial connection between the sets enables multiple divisions of the acoustic spectrum into different bands having selected cutoff points.

17. The electronic crossover module of claim 16, wherein the first signal channel is configured as a high pass channel, the high pass channel being continuously adjustable so as to provide a cutoff frequency between 125Hz and 12.5kHz.

18. The electronic crossover module of claim 17, wherein the second signal channel is configured as a high bandpass channel, the high bandpass channel being continuously adjustable so as to have a passband residing between 32Hz and 12.5kHz.

19. The electronic crossover module of claim 18, wherein the third signal channel is configured as a low bandpass channel, the low band pass band residing between 80Hz and 3.2kHz.

20. The electronic crossover module of claim 19 further comprising a subwoofer channel, the subwoofer channel processing a summed signal composed of all input signals.

* * * * *

UNITED STATES PATENT AND TRADEMARK OFFICE

CERTIFICATE OF CORRECTION

PATENT NO. : 5,111,508

DATED : May 5, 1992

INVENTOR(S) : Vannin Gale et al.

It is certified that error appears in the above-identified patent and that said Letters Patent is hereby corrected as shown below:

Column 6, line 56, "multiresponse" should read --multireflecting--; line 56, strike "reflecting" after "multireflecting--; line 58, strike "the" after "infinite". Column 9, line 15, "of" should read --or--. Column 10, line 16, "reproduces" should read --reproducers--; line 33, "he" should read --the--.

Signed and Sealed this

Twenty-eighth Day of September, 1993

Attest:

BRUCE LEHMAN

*Attesting Officer* *Commissioner of Patents and Trademarks*